United States Patent [19]

Doubek, Jr. et al.

[11] 3,909,933

[45] Oct. 7, 1975

[54] METHOD FOR TRANSFERRING AND BONDING ARTICLES

[75] Inventors: Edward R. Doubek, Jr., Brookfield; John J. Kennedy, Riverside; Donald K. Sandmore, Oak Lawn, all of Ill.

[73] Assignee: Western Electric Company, Incorporated, New York, N.Y.

[22] Filed: Apr. 26, 1974

[21] Appl. No.: 464,423

Related U.S. Application Data

[62] Division of Ser. No. 346,559, March 30, 1973, Pat. No. 3,838,274.

[52] U.S. Cl. .......................... 29/626; 29/493; 228/10

[51] Int. Cl.² .......................... G01J 1/20

[58] Field of Search .......... 29/626, 493, 577, 589; 228/8, 9, 10

[56] References Cited

UNITED STATES PATENTS

| | | | |
|---|---|---|---|
| 3,391,473 | 7/1968 | Hays | 29/626 |
| 3,392,256 | 7/1968 | Bradham | 29/626 |
| 3,548,493 | 12/1970 | Hubbard | 29/626 |
| 3,559,279 | 2/1971 | Miklaszewski | 29/493 |
| 3,591,911 | 7/1971 | Goldschmied | 29/626 |
| 3,611,544 | 10/1971 | Frels | 29/626 |
| 3,793,710 | 2/1974 | Monahan | 29/626 |

*Primary Examiner*—Al Lawrence Smith
*Assistant Examiner*—Robert C. Watson
*Attorney, Agent, or Firm*—R. A. Lloyd

[57] ABSTRACT

A substrate to which electrical circuit elements, such as integrated circuit (IC) chips, are to be bonded to bond sites on a surface thereof, is positioned on a substrate support table which is actuable to move in directions parallel to orthogonal *x-y* axes to successively position the substrate bond sites at a bonding location. First and second arrays of circuit elements are carried on first and second tables, respectively, which are positioned on opposite sides of the substrate support table. The first and the second tables are actuable to move in directions parallel to the x-y axes, upon the positioning of substrate bond sites at the bonding location, to position successive circuit elements of the first and the second arrays of elements at first and second pickup locations, respectively. A pair of bonding devices, the first for transferring circuit elements of the first array from the first pickup location to the bonding location and the second for transferring circuit elements of the second array from the second pickup location to the bonding location, alternately pick up circuit elements of the first and the second arrays at the first and the second pickup locations, respectively, transfer the circuit elements to the bonding location, and bond the elements to a bond site thereat.

4 Claims, 18 Drawing Figures

METHOD FOR TRANSFERRING AND BONDING ARTICLES

This is a division of application Ser. No. 346,559, filed Mar. 30, 1973, which issued on Sept. 24, 1974, as U.S. Pat. No. 3,838,274.

BACKGROUND OF THE INVENTION

1. Field of the Invention

The present invention relates to a method of transferring and bonding workpieces to articles, and in particular to a method of transferring integrated circuit (IC) chips from first and second arrays of the chips to selected bond sites on a substrate to be bonded thereto.

2. Description of the Prior Art

With the advent of IC chips in the electronics industry has arisen the problem of bonding the leads of the chips to conductor paths carried on a substrate. The extremely small size of the chips requires viewing the chips with a microscope to position peripherally extending leads over, and to bond the leads to, selected conductors at predetermined locations on the substrate.

An existing system for bonding the leads of IC chips to conductors on a substrate is typified in U.S. Pat. Nos. 3,477,630 and 3,604,099, both to F. J. Schneider and assigned to Western Electric Company. As disclosed in those patents, the technique for bonding the leads of IC chips to conductors on a substrate contemplates viewing, through a microscope, an IC chip supported on a carrier, and manipulating the carrier until the chip is defined within a reticle in the microscope. An IC chip bonding head, which is mounted for movement between a rest position and the IC chip position when the chip is defined within the reticle in the microscope, is then actuated to pick up and hold the IC chip. Next, the location on the substrate where the IC chip is to be bonded is defined within the same reticle in the microscope by manipulating the substrate. The IC chip bonding head is also mounted to bond a chip on a substrate location as defined in the reticle in the microscope, and after the bonding location on the substrate is defined within the reticle the bonding head is actuated to bond the IC chip held therein to the conductors at the bonding location on the substrate. This procedure is time consuming, and therefore expensive, in that for each IC chip bonded to a substrate, operator time is required to manipulate both the IC chip and the bonding location on the substrate within the reticle in the microscope.

Another system for bonding electronic elements to a substrate is disclosed in U.S. Pat. No. 3,611,561. In this patent, circuit elements from a supply of elements are transferred to, and bonded to, a substrate. The relative position of the circuit elements on the substrate, after transfer and bonding, are identical with their previous relative positions in the supply of elements. To achieve transfer and bonding of the elements, a single bonding device is moved between the supply of elements and the substrate in response to manual movement of an indicator device to predetermined positions on a template, the indicator device being interconnected with the bonding device through an appropriate gear train. This system not only requires that the circuit elements in the supply of elements always be in relative positions which are identical with their relative positions when they are bonded on the substrate, as well as requiring attendance by an operator for moving the indicator device, but also the bonding rate of the apparatus is relatively slow in that only one bonding head is employed.

SUMMARY OF THE INVENTION

In accordance with the present invention, a system for bonding workpieces to an article at a plurality of workpiece receiving locations on a surface thereof includes a first support for positioning a first workpiece at a first predetermined location, a second support for positioning a second workpiece at a second predetermined location, and a third support for positioning the article with a selected first one of the workpiece receiving locations at a third predetermined location. Also included is a first transfer mechanism, rendered effective upon positioning the selected first one of the workpiece locations at the third predetermined location, for transferring the first workpiece from the first predetermined location to the selected first one of the workpiece receiving locations on the article at the third predetermined location, and for bonding the workpiece thereto, as well as means for moving the third support, after the first workpiece is bonded to the first workpiece receiving location, for repositioning the article with a selected second one of the workpiece receiving locations at the third predetermined location. Further included is a second transfer device, rendered effective upon positioning the selected second one of the workpiece receiving locations at the third predetermined location, for transferring the second workpiece from the second predetermined location to the selected second one of the workpiece receiving locations on the article at the third predetermined location, and for bonding the workpiece thereto.

Preferably, the system is for bonding electrical circuit elements to selected bonding sites on a surface of each of a plurality of substrates, and the first support is a first movable table, for supporting a first array of the circuit elements, which is actuable to move in directions parallel to orthogonal $x$-$y$ axes to position selected ones of the circuit elements of the first array at the first predetermined location. The second support is a second movable table, for supporting a second array of the circuit elements, which is actuable to move in directions parallel to the $x$-$y$ axes to position selected ones of the circuit elements of the second array at the second predetermined location, and the third support is a third movable table, for supporting the substrate, which is actuable to move in directions parallel to the $x$-$y$ axes to position selected substrate bonding sites at the third predetermined location. A substrate transfer mechanism moves a substrate from a supply of substrates, in a first direction along a path parallel to the $x$ axis, and positions the substrate on the third movable table, and the first transfer device is a first circuit element bonding device for selectively picking up individual circuit elements of the first array at the first predetermined location, for carrying the picked up circuit element to a bonding site on the substrate at the third predetermined location, and for bonding the circuit element thereto.

The second transfer device is a second circuit element bonding device for selectively picking up individual circuit elements of the second array at the second predetermined location, for carrying the picked up circuit element to a bonding site on the substrate at the third predetermined location, and for bonding the circuit element thereto, and a mechanism is included for sequentially actuating the third table to position successive bonding sites on the substrate at the third predetermined location. Also included is a mechanism, operative upon each actuation of the third table, for sequentially and alternately actuating the first and the second tables to alternately position successive circuit elements of the first and the second arrays at the first and the second predetermined locations, respectively. Further included is a driving device, operative upon each positioning of a circuit element of the first array at the first predetermined location, for moving the first circuit element bonding device between the first and the third predetermined locations for picking up the circuit element of the first array at the first predetermined location, for carrying the circuit element to the third predetermined location, and for bonding the circuit element to the substrate bonding site at the third predetermined location, as well as a driving device, operative upon each positioning of a circuit element of the second array at the second predetermined location, for moving the second circuit element bonding device between the second and the third predetermined locations for picking up the circuit element of the first array at the second predetermined location, for carrying the circuit element to the third predetermined location, and for bonding the circuit element to the substrate bonding site at the third predetermined location. A substrate removal mechanism, which is operative after a predetermined number of circuit elements have been bonded to the substrate, moves the substrate from the third table, in the first direction parallel to the $x$ axis, to a substrate receiving location.

Other objects, advantages and features of the invention will be apparent upon consideration of the following detailed description when taken in conjunction with the appended drawings.

DETAILED DESCRIPTION

General Description

Figure 1:
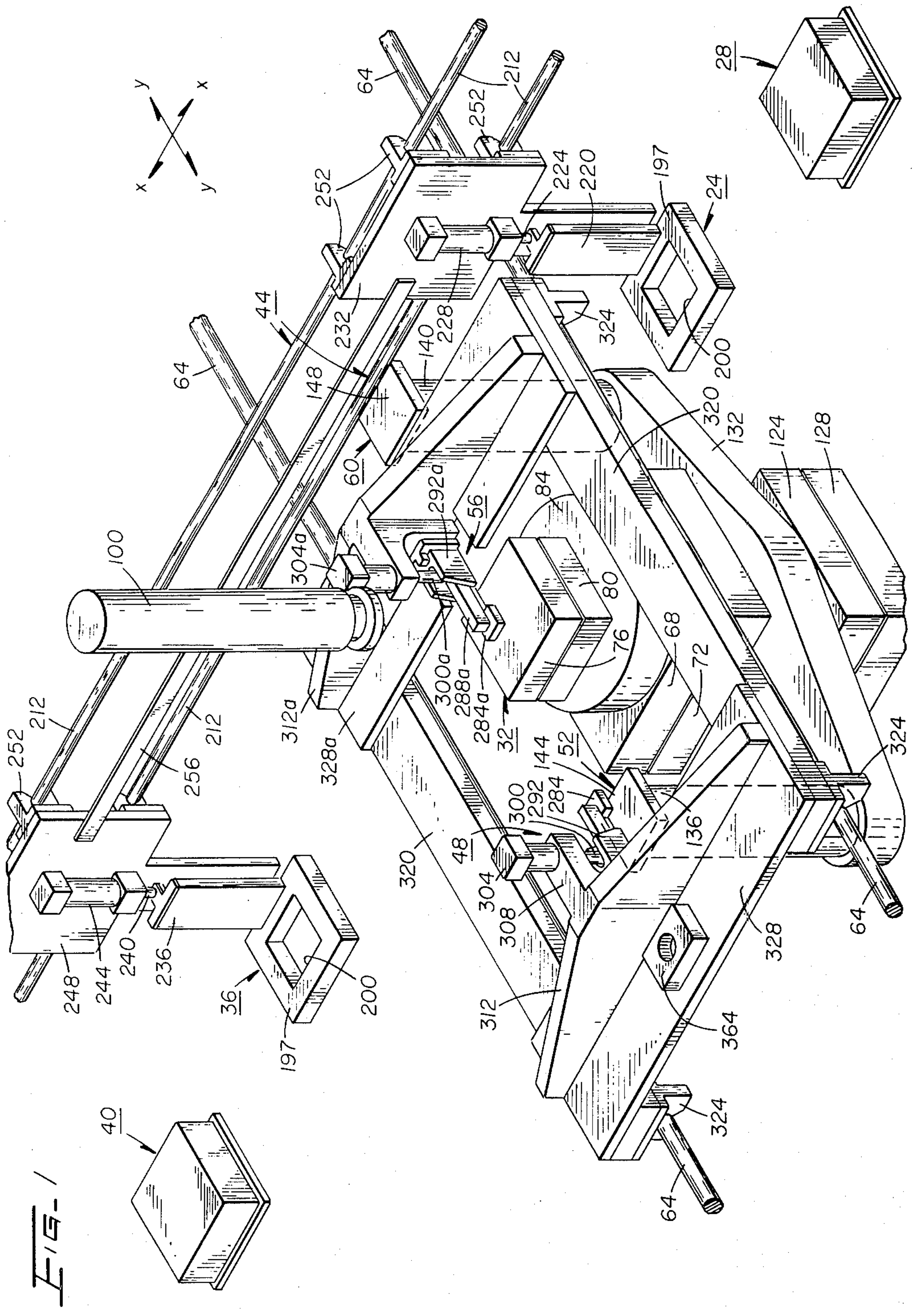
FIG. 1 is an isometric view partially showing the arrangement of the apparatus of the invention for bonding integrated circuit (IC) chips to a substrate.

The electro-optical article positioning and bonding system of the invention, as shown generally in FIG. 1 of the drawings, for bonding beam leaded integrated circuit (IC) chips to conductors at selected locations on a substrate in response to a numeric-control (N/C) input, includes a first substrate transfer head 24 for sequentially conveying substrates, to have IC chips bonded thereto, from a substrate pick-up station 28 to a substrate chip bonding station 32, and a second substrate transfer head 36 for sequentially conveying substrates, having IC chips bonded thereto, from the bonding station 32 to a substrate delivery station 40. Each of the transfer heads 24 and 36 moves essentially reciprocatingly along a horizontal path in an x direction as defined by a trackway 44, and the relationship between the bonding heads is such that while the head 24 is picking up a new substrate from the station 28 the head 36 is removing a substrate having IC chips bonded thereto from the bonding station 32, and while the head 24 is placing the new substrate on the bonding station 32 the head 36 is placing the completed substrate on the delivery station 40.

To bond the IC chips to a substrate on the bonding station 32, a first bonding head 48 sequentially receives individual IC chips at a first IC chip pick-up station 52 and carries the chips to the substrate for bonding thereon, and a second bonding head 56 sequentially receives individual IC chips at a second IC chip pick-up station 60 and similarly carries the chips to the substrate for bonding thereon. Each of the bonding head 48 and 56 moves essentially reciprocatingly along a horizontal path in a y direction as defined by a trackway 64, and the relationship between the bonding heads is such that while the bonding head 48 is receiving an IC chip at the station 52 the bonding head 56 is bonding a chip to the substrate, and while the bonding head 48 is bonding an IC chip to the substrate the head 56 is receiving a chip at the station 60.

The bonding heads 48 and 56 are arranged to always deliver each IC chip, to be bonded to the substrate, to the same position on the bonding station 32. Therefore, to bond the chips at selected different bonding locations on the substrate, it is necessary to position the substrate at selected *x* and *y* locations with respect to the bonding heads. To accomplish this, the bonding station 32 is movable by conventional N/C *x* and *y* tables 68 and 72, respectively, which are actuable by a conventional controller (not shown), in response to preprogrammed information, to position the substrate at selected *x* and *y* locations so that IC chips may be bonded to the substrate at selected bonding locations.

As a result of the small size of both the IC chips and the bonding locations on the substrate, it is necessary to first precisely orient each bonding location on the substrate with respect of the zero position of each of the N/C *x* and *y* tables 68 and 72, respectively, to thereafter permit each bonding location on the substrate to be accurately positioned by the tables 68 and 72 with respect to a chip carried by a bonding head 48 or 56. To accomplish this, the bonding station 32 is carried on a conventional analog *x* table 76. The analog *x* table 76 is in turn carried on a conventional analog y table 80, which in turn is carried on a conventional analog $\theta$ table 84. The analog $\theta$ table 84 is supported on the N/C x table 68 with its axis of rotation in line with the 0, 0 reference position of the N/C tables 68 and 72.

Figures 5, 6, 7:
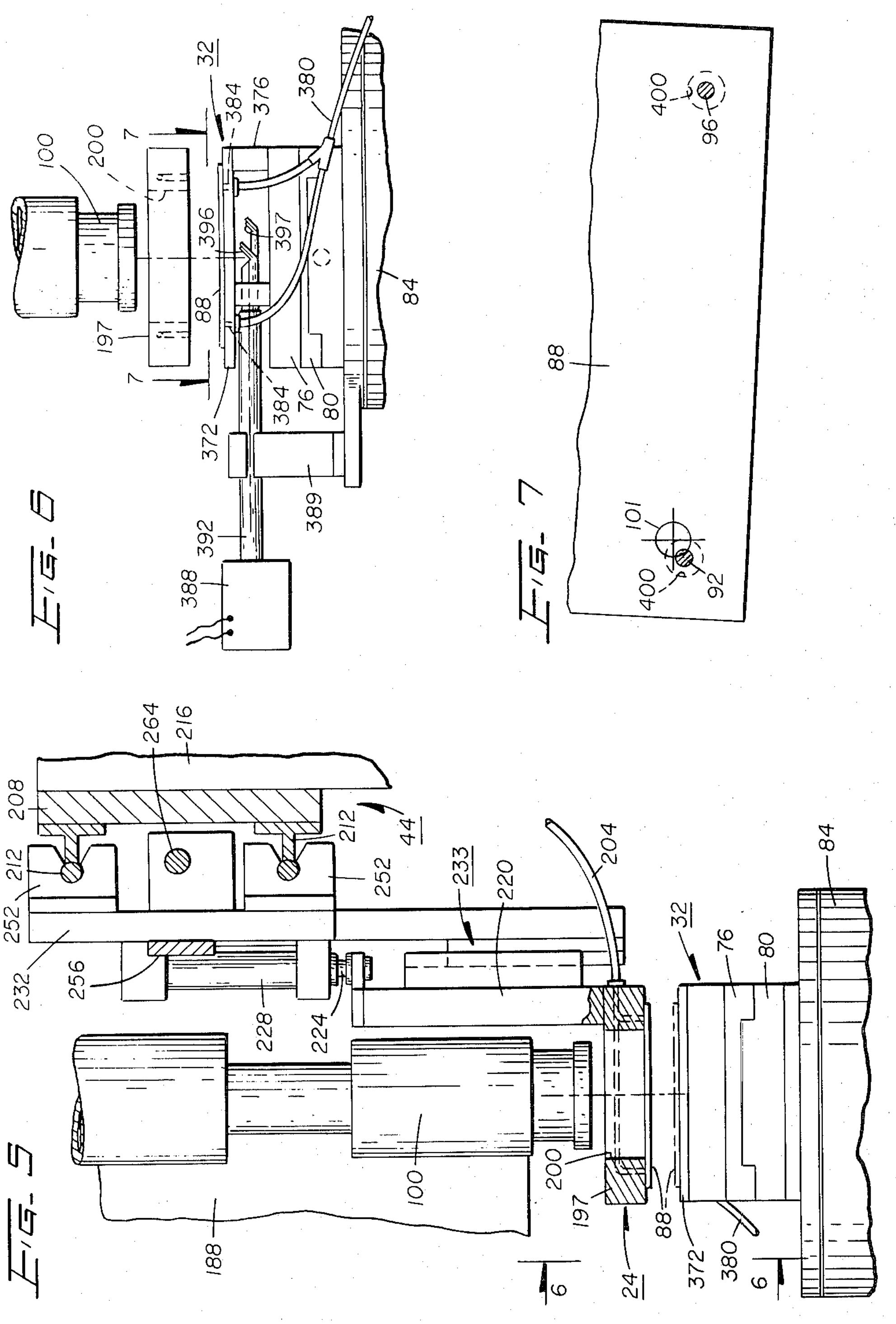
FIG. 5 is a partially sectional view of the substrate transfer mechanism and the support therefor.
FIG. 6 is a view taken along the line 6—6 of FIG. 5, and shows an arrangement for backlighting and viewing with a tv camera a substrate positioned on a support on the numeric controlled table.
FIG. 7 is a view taken along the line 7—7 of FIG. 6, and shows the two reference dots on the surface of the substrate in FIG. 6.

Each substrate, such as the substrate 88 shown in FIG. 7, has each bonding location thereon precisely located with respect to first and second reference dots, or marks, 92 and 96, respectively. The reference dots 92 and 96 are each 25 mils in diameter, and with the N/C *x* and *y* tables 68 and 72 in the 0, 0 position the substrate transfer head 24, in delivering the substrate 88 to the bonding station 32, positions the substrate on the bonding station 32 with the first reference dot 92 thereof within 10 mils of the 0, 0 point, and with the second reference dot 96 thereof within 10 mils of a predetermined x, y point, of the N/C *x* and *y* tables 68 and 72. Preferably, the predetermined *x, y* point of the reference dot 96 lies along the *x* axis of the N/C *x* and *y* tables 68 and 72.

Figure 8:
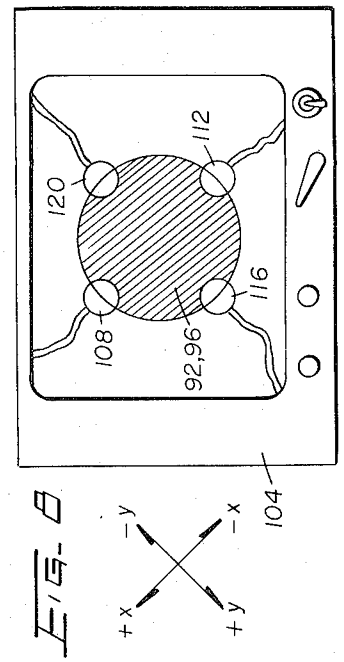
FIG. 8 is a view of a substrate reference dot on a tv monitor screen as picked up by the tv camera of FIG. 6.
Figure 11:
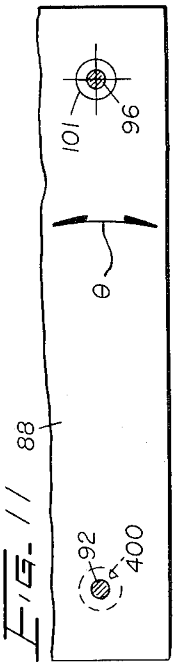
FIG. 11 is a view of the substrate in FIG. 6, showing the $\theta$ movement thereof to orient the second reference dot with respect to the photocells on the tv monitor of FIG. 8.
Figure 9:
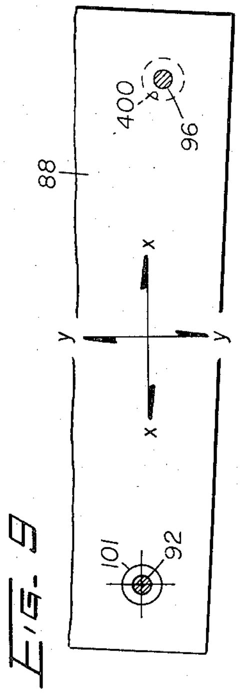
FIG. 9 is a view of the substrate in FIG. 6 showing the X-Y movement thereof to orient a first one of the reference dots with respect to photocells shown on the tv monitor of FIG. 8.

To precisely orient the bonding locations on the substrate 88 with respect to the N/C *x* and *y* tables 68 and 72, a tv camera 100 is positioned with its optical axis in alignment with the 0, 0 reference point of the N/C *x* and *y* tables 68 and 72 for viewing an immediate area 101, as shown in FIG. 9, of the substrate above the 0, 0 reference point of the N/C *x* and *y* tables 68 and 72, to provide an image thereof on the screen of a tv monitor 104 as shown in FIG. 8. Four photocells 108, 112, 116 and 120 are secured to the screen of the monitor 104 at 90° intervals, and are each positioned to partially overlie a portion of the periphery of the reference dot 92, as detected by the camera 100, when the dot 92 is centered with respect to the 0, 0 reference point of the N/C *x* and *y* tables 68 and 72. Since each reference dot is 25 mils in diameter, and since the transfer head 24 positions the substrate 88 on the bonding station 32 with the reference dot 92 within 10 mils of the 0, 0 reference point of the N/C *x* and *y* tables 68 and 72 when the N/C tables are in their 0, 0 position, at least one of the photocells 108, 112, 116 or 120 will sense the image of the dot 92 on the screen of the monitor 104 when the substrate 88 is first positioned on the bonding station 32. The photocells are then responsive to actuate, through circuitry to be later described, servo-motors associated with the analog x and y tables 76 and 80 to center the reference dot 92 with respect to the photocells, and therefore with respect to the 0, 0 reference point of the N/C x and y tables 68 and 72. In this case, the photocells 108 and 112 are responsive, in accordance with the detected or sensed intensity of the image on the screen of the monitor 104, to actuate servo-motors to move the analog *x* table 76 in either a + *x* or −*x* direction, and the photocells 116 and 120 are similarly responsive to actuate servo-motors to move the analog *y* table 80 in either a +*y* or −*y* direction, until the reference dot 92 is centered with respect to each of the photocells 108, 112, 116 and 120.

Figure 10:
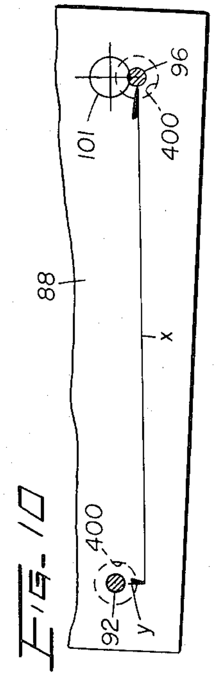
FIG. 10 shows the amount and direction of movement required by the numeric-control table to bring the second one of the reference dots within the field of view of the tv camera.

With the reference dot 92 on the substrate 88 centered above the 0, 0 reference point of the N/C *x* and *y* tables 68 and 72, it is only necessary to rotationally orient the substrate 88 about the reference dot 92, and with respect to the tables 68 and 72, to precisely orient each and every bonding location on the substrate 88 with respect to the 0, 0 position of the tables 68 and 72. This is accomplished by shifting the N/C *x* and *y* tables 68 and 72 to the predetermined *x, y* position of the reference dot 96, as shown in FIG. 10, which, as stated previously, preferably lies along the *x* axis of the N/C *x* and *y* tables 68 and 72. Since the reference dot 96 has a diameter of 25 mils, and since the transfer head 24 positioned the substrate 88 on the bonding station 32 with each of its reference dots 92 and 96 within 10 mils of their predetermined position, this shift will position the reference dot 96 below, or essentially below, the tv camera 100, so that an image of the dot 96 will appear on the monitor 104 and will underlie at least one of the photocells 116 or 120. In this case, the photocells 116 and 120 are responsive to actuate servomotors associated with the analog $\theta$ table to rotate the $\theta$ table about its axis, which is centered with the 0, 0 reference point of the N/C *x* and *y* tables 68 and 72, and therefore with the reference dot 92, until the reference dot 96 is centered with respect to each of the photocells 116 and 120. Since each of the bonding locations on the substrate are precisely located with respect to the reference dots 92 and 96, and since the reference dots 92 and 96 are now precisely referenced with respect to the N/C *x* and *y* tables 68 and 72, each and every bonding location on the substrate 88 is now referenced with respect to the 0, 0 position of the N/C *x* and *y* tables 68 and 72. If the position of the bonding heads 48 and 56 above the bonding station 32 is adjusted to be over the 0, 0 reference position of the N/C *x* and *y* tables 68 and 72, the substrate 88 may now be accurately positioned to receive IC chips carried by the bonding heads by shifting the N/C *x* and *y* tables 68 and 72 to the *x, y* positions of the bonding locations on the substrate 88.

Figure 13:
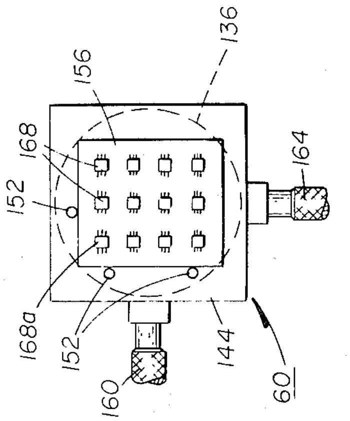
FIG. 13 is a view, taken along the line 13—13 of FIG. 12, showing the arrangement of the IC chips on the carrier.

The bonding heads 48 and 56, when returning to a position above the pick-up stations 52 and 60, respectively, to receive an IC chip to be carried to and bonded on the substrate 88, always return to the same position. Therefore, it is necessary to continuously position new IC chips beneath the bonding heads to be received thereby. This is accomplished by providing a second N/C *x* table 124 and a second N/C *y* table 128, which together move a support arm 132 in an *x* and *y* direction. The arm 132 has at each of its ends an upstanding post 136 or 140, the post 136 carrying on its upper end a horizontal plate 144 and the post 140 carrying on its upper end a horizontal plate 148. Each plate, such as the plate 144 shown in FIG. 13, has three upright locating posts 152 adapted to orient an IC chip carrier 156 positioned on the plate, and is adjustable in an *x* and a *y* direction, with respect to its associated upstanding post 136 or 140, by means of two micrometer adjustment drives 160 and 164.

Figures 4, 15, 16:
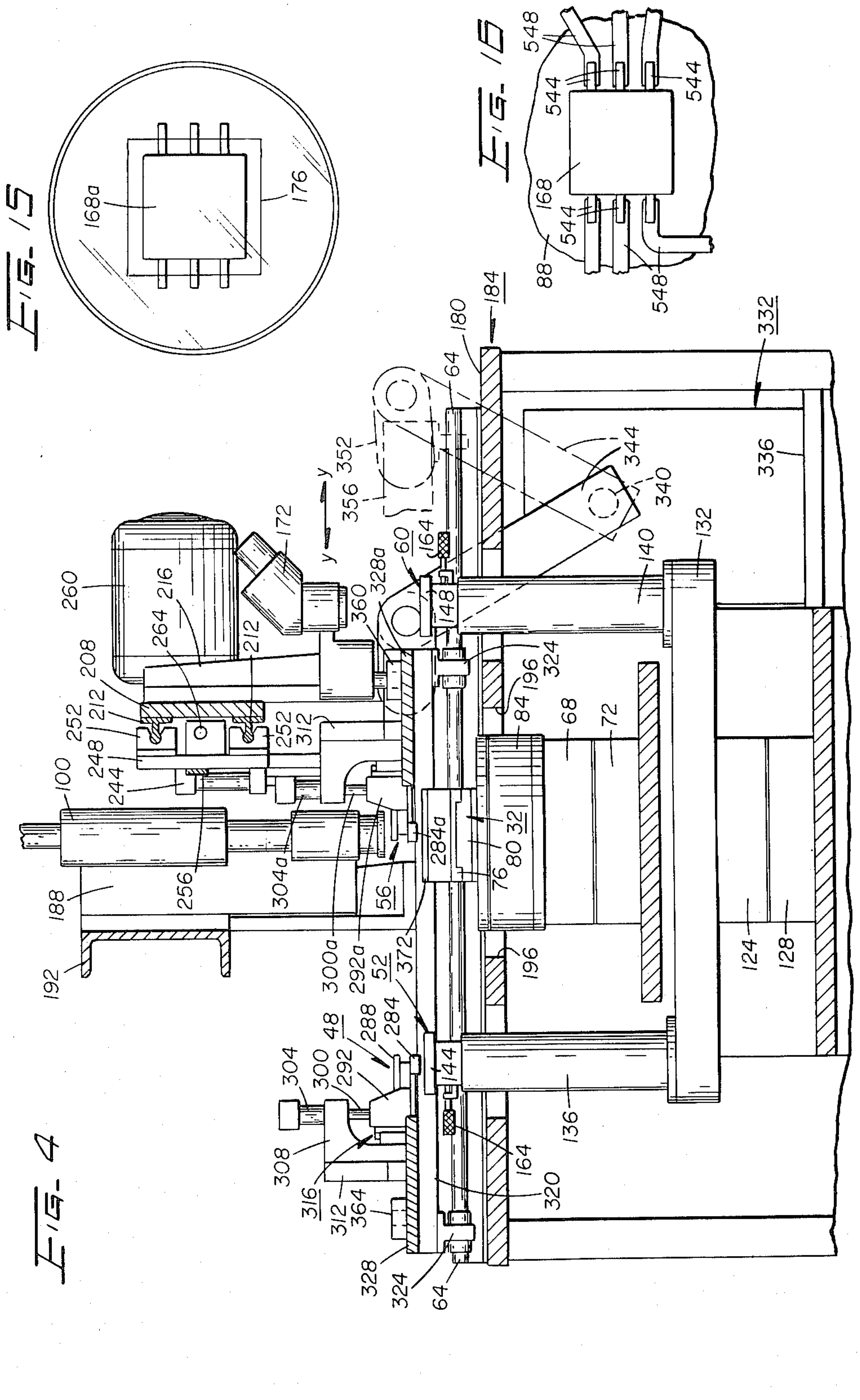
FIG. 4 is a view taken along the line 4—4 of FIG. 2, and illustrates the arrangement of the IC chip transfer mechanism.
FIG. 15 shows an IC chip on the carrier as viewed through a microscope and as positioned within a reticle thereof.
FIG. 16 shows an IC chip bonded to conductors on the substrate.

Each IC chip carrier 156 has a plurality of IC chips 168 carried thereon which are precisely located one with respect to the other. To orient each of the IC chips 168 with respect to the N/C *x* and *y* tables 124 and 128, so that the tables 124 and 128 may be actuated to position successive IC chips 168 in a position to be received by the bonding head 48 or 56, the N/C *x* and *y* tables 124 and 128 are moved to their 0, 0 location and an impression is made in a malleable material, such as aluminum, carried on each of the pick-up stations 52 and 60, with the associated bonding head 48 or 56. A microscope, associated with each of the pick-up stations 52 and 60 to view IC chips thereon, such as the microscope 172 shown in FIG. 4, is then adjusted with respect to its pick-up station 52 or 60 until the impression in the malleable material is centered within a reticle thereof. This permanently positions each microscope so that the area viewed within the reticle thereof is the area above which the bonding head will be positioned when it is above the pick-up station for receiving an IC chip. Alternatively, an ink may be applied to the end of the bonding head, and the image thereof "stamped" on the pick-up station may be centered within the reticle of the microscope.

With the microscopes so oriented, a carrier 156 is located on each of the pick-up stations 52 and 60 by the locating posts 152, and a selected one of the IC chips supported on each carrier, such as the chip 168*a*, is observed through a microscope, such as the microscope 172. The chip 168*a* is then accurately positioned, by means of the micrometer adjustment drives 160 and 164, within the reticle of the microscope, such as the reticle 176 as shown in FIG. 15. Since the reticle of the microscope is positioned over the IC chip pick-up area of its associated bonding head, the IC chip centered in the reticle 176 is positioned to be received by its associated bonding head 48 or 56. This precisely locates each of the IC chips 168 on each carrier 156 both with respect to the 0, 0 position of the N/C *x* and *y* tables 124 and 128 and with respect to the chip receiving position of the bonding head 48 or 56, and the N/C *x* and *y* tables 124 and 128 may now be actuated to bring successive IC chips 168 into registry with the bonding heads 48 and 56 to be received thereby.

With a substrate and the IC chips to be bonded thereto referenced both with respect to themselves and with respect to the 0, 0 reference positions of associated N/C *x* and *y* tables, a conventional controller may be programmed, by a punched tape or other means, to actuate the N/C *x* and *y* tables 124 and 128 to position successive IC chips to be received by the bonding heads 48 and 56 at the pick-up stations 52 and 60, respectively, and to actuate the N/C *x* and *y* tables 68 and 72 to position selected bonding locations, on a substrate 88, for receiving an IC chip carried by one of the bonding heads, so that the IC chips may be automatically, accurately and rapidly bonded to conductors on the substrate.

Specific Description

Figure 2:
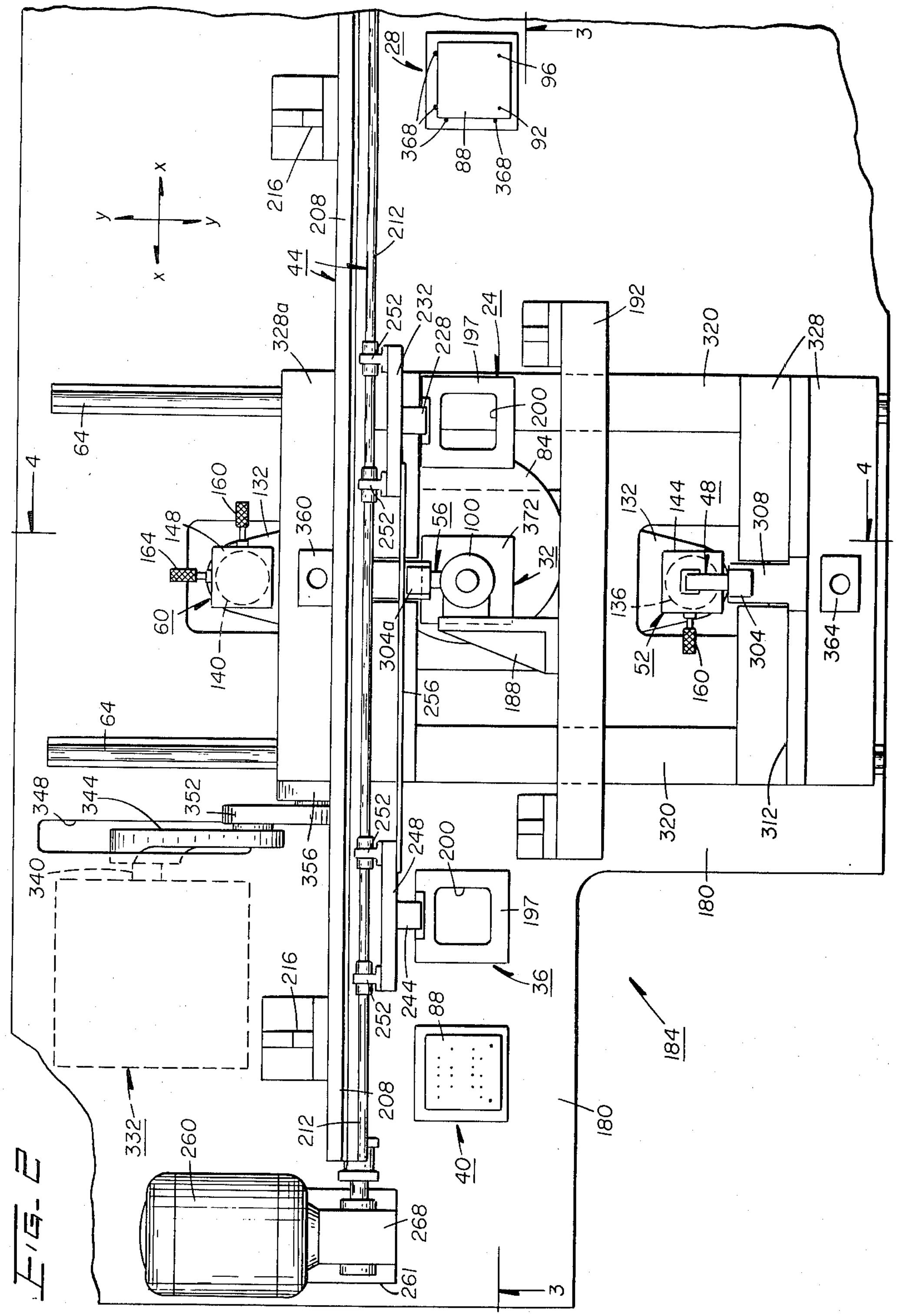
FIG. 2 is a top plan view illustrating the relationship of the substrate and IC chip transferring portion of the apparatus.

Referring to FIG. 2, a top 180 of a table 184 supports the substrate and IC chip transferring mechanisms of the system, as well as the tv camera 100 for viewing a substrate. The camera 100, for viewing a substrate on the bonding station 32, is positioned above the bonding station by an arm 188 secured to a U-shaped support 192 which rests, at the end of each of its legs, on the top 180. An opening 196 is provided in the top 180 since, as will be shown later, the N/C tables 68 and 72, for positioning a substrate, are supported beneath the top 180 of the table 184.

Each of the substrate transfer heads 24 and 36 has a square peripheral portion 197 which defines an essentially square open area 200 in the center thereof. The configuration of the transfer heads 24 and 36 is such that the open area 200 avoids contact of the transfer heads with the relatively fragile bonding pads and cross-over conductors on the surface of the substrate while the substrate is being conveyed by the transfer heads, while the peripheral portion 197, as shown in FIG. 5, engages the edges of a substrate where wide power paths are normally located. To secure the substrate to the transfer heads 24 and 36, a vacuum is provided through a vacuum line 204 to openings in the substrate engaging surface of the peripheral portion 197 of each of the transfer heads.

Referring to both FIGS. 2 and 5, the trackway 44, along which the substrate transfer heads 24 and 36 reciprocatingly move, is comprised of an upright support 208 extending above and parallel to the table top 180 and having a pair of parallel tracks 212 secured thereto and similarly extending parallel to the table top. The upright support 208 is carried at each of its ends by the upper end of an upright pillar 216, the lower ends of which rest on the table top 180.

Figure 3:
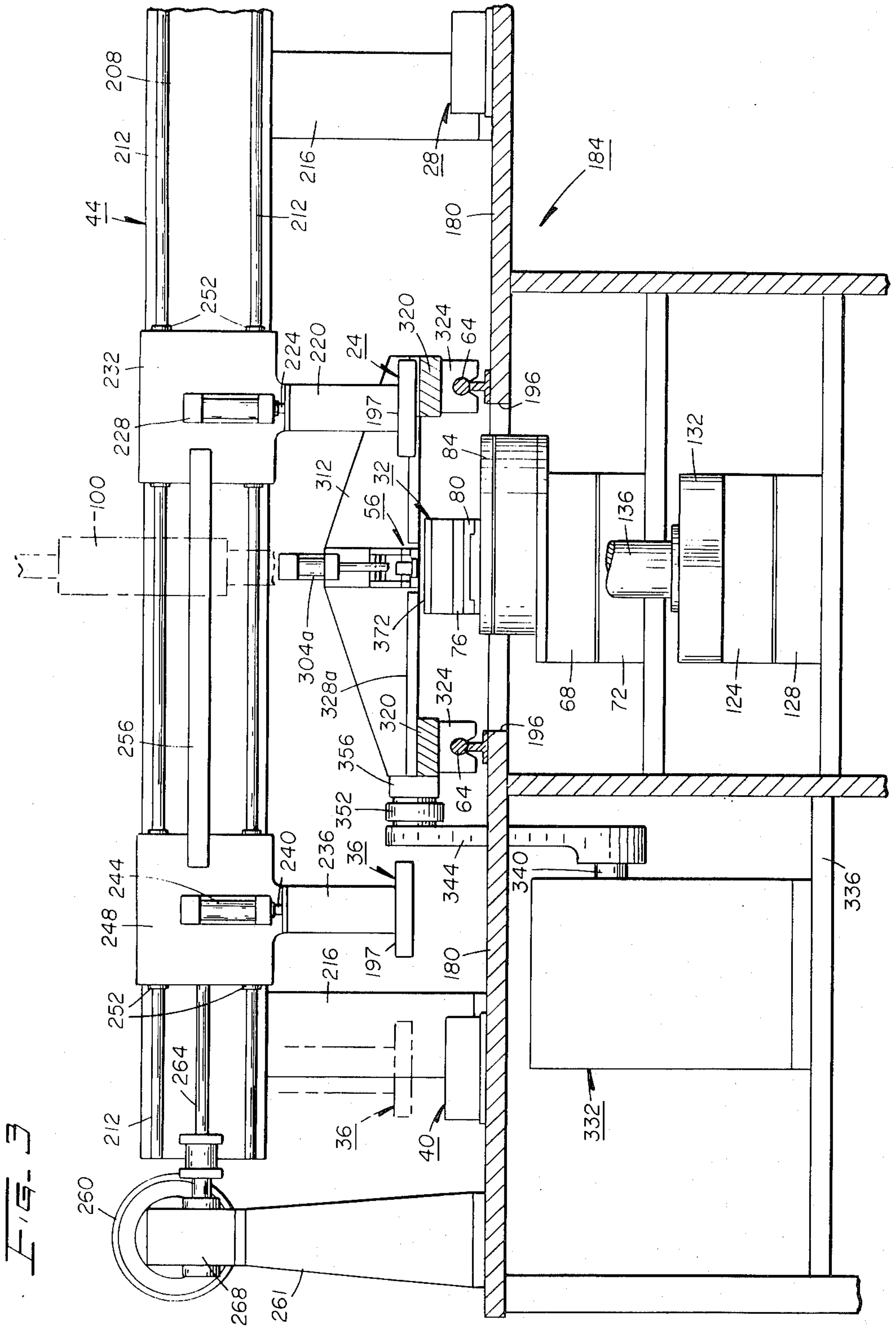
FIG. 3 is a view taken along the line 3—3 of FIG. 2, and shows the arrangement both of the substrate transfer mechanism and of the bonding head with respect to the numeric controlled table for supporting the substrate.

To support the substrate transfer heads for movement along the trackway 44, and for carrying substrates, the transfer head 24, as shown in FIG. 3, is secured to the lower end of a vertical arm 220, the upper end of which is secured to a plunger 224 of an air cylinder 228 for vertical movement therewith. The air cylinder 228 is in turn mounted on the face of a plate 232. Secured to and between the vertical arm 220 and the lower portion of the face of the plate 232 is an antifriction table 233, such as a Schneeberger Anti-Friction Positioning Table sold by the Industrial Tools Division of the Bendix Corporation in Chicago, Illinois, for guiding the vertical motion of the transfer head 24. The substrate transfer head 36 is similarly secured to the lower end of a vertical arm 236, the upper end of which is secured to a plunger 240 of an air cylinder 244. The air cylinder 244 is in turn mounted on the face of a plate 248, and secured to and between the vertical arm 236 and the lower portion of the plate 248 is an anti-friction table (not shown) for guiding the vertical motion of the transfer head 36. Each of the plates 232 and 248 is slidably secured to the trackway 44, for horizontal movement therealong, by means of linear bearings 252, secured one at each of the four corners on the back surface of each plate 232 and 248, which cooperate, in a manner similar to a dovetail arrangement, with the horizontally extending tracks 212 of the trackway 44 to secure the plates 232 and 248, and therefore the substrate transfer heads 24 and 36, for horizontal movement along the path defined by the trackway 44.

To maintain the transfer heads 24 and 36 in a fixed spaced relationship as they reciprocatingly move along the trackway 44, a spacer bar 256 is secured to and between the plates 232 and 248 to fix the spacing therebetween such that, when the transfer head 24 is positioned above the pick-up station 28, the transfer head 36 is positioned above the bonding station 32, and when the transfer head 24 is positioned above the bonding station 32, the transfer head 36 is positioned above the delivery station 40.

Reciprocating movement of the substrate transfer heads 24 and 36 is accomplished through the use of a reversible motor 260, supported above the table top 180 by a support 261, which rotates a threadless drive shaft 264 through a right angle gear box 268. The threadless drive shaft 264 comprises one portion of a conventional Roh'lix liner actuator, the other portion of which is a rider (not shown) which receives the threadless drive shaft 264 therethrough and which is secured to the back surface of the plate 248. The rider contains six free wheeling rollers, three to an end, which are angled relative to the longitudinal axis of the drive shaft 264 and which are spring loaded against the drive shaft. As the shaft 264 turns, the rollers describe a helical path along the shaft and move the rider, and therefore the plate 248, forward or backward along the trackway 44 in accordance with the direction of rotation of the shaft 264. The speed at which the plate 248 travels along the threadless drive shaft 264 is governed by the rotational rate of the shaft and by the angle between the drive shaft and the axis of the rollers, the angle corresponding to the pitch or lead of a conventional screw thread. Movement of the plate 248 along the trackway 44 in turn imparts a similar movement to the plate 232, and therefore to the transfer head 24, through the spacer bar 256 secured between the plates 248 and 232.

The operation of the substrate transfer portion of the apparatus of the invention is such that, after a substrate 88 on the bonding station 32 has IC chips 168 bonded thereto, the motor 260 is actuated to position the transfer head 36 above the substrate on the bonding station 32 and to position the transfer head 24 above a new substrate on the pick-up station 28. The air cylinders 228 and 244 are then actuated to lower the transfer heads 24 and 36, respectively, to bring the peripheral portions 197 thereof into engagement with the outer peripheral portions of each of the substrates, with the center circuit portion of each substrate being received within the square opening 200 defined by the peripheral portion 197. A vacuum is then applied to each of the peripheral portions 197 of the transfer heads, through the vacuum line 204, to secure to the transfer head 24 a new substrate 88 positioned on the pick-up station 28 and to secure to the transfer head 36 a completed substrate positioned on the bonding station 32. The air cylinders 228 and 244 are then actuated to vertically elevate the substrates above the pick-up and bonding stations, and the motor 260 is energized to horizontally move the plates 232 and 248, and therefore the substrate transfer heads 24 and 36, until the transfer head 24 is positioned above the bonding station 32 and the transfer head 36 is positioned above the substrate delivery station 40. The air cylinders 228 and 244 are then actuated to lower the transfer heads 24 and 36 to position a new substrate on the bonding station 32 and to position the completed substrate on the delivery station 40, the vacuum applied through the line 204 is interrupted to release each of the substrates 88 from its associated transfer head, and the air cylinders 228 and 244 are again actuated to vertically elevate each of the transfer heads 24 and 36. The motor 260 is then energized to position the transfer heads 24 and 36 on opposite sides of the bonding station 32 to permit access to the substrate on the bonding station 32 by the bonding heads 48 and 56. It is to be appreciated that the camera 100 is mounted sufficiently above the bonding station 32 to permit passage therebeneath by the transfer heads 24 and 36 when the heads are in their uppermost position.

Figure 14:
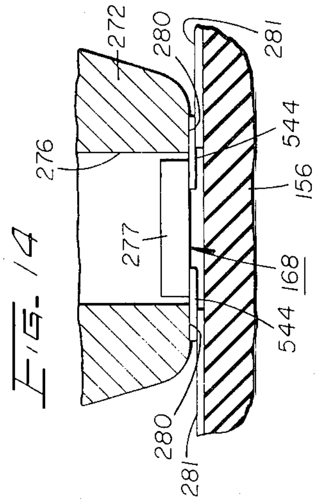
FIG. 14 is an enlarged, cross-sectional view of the end of the bonding head, illustrating the manner in which an IC chip is held therein.
Figure 12:
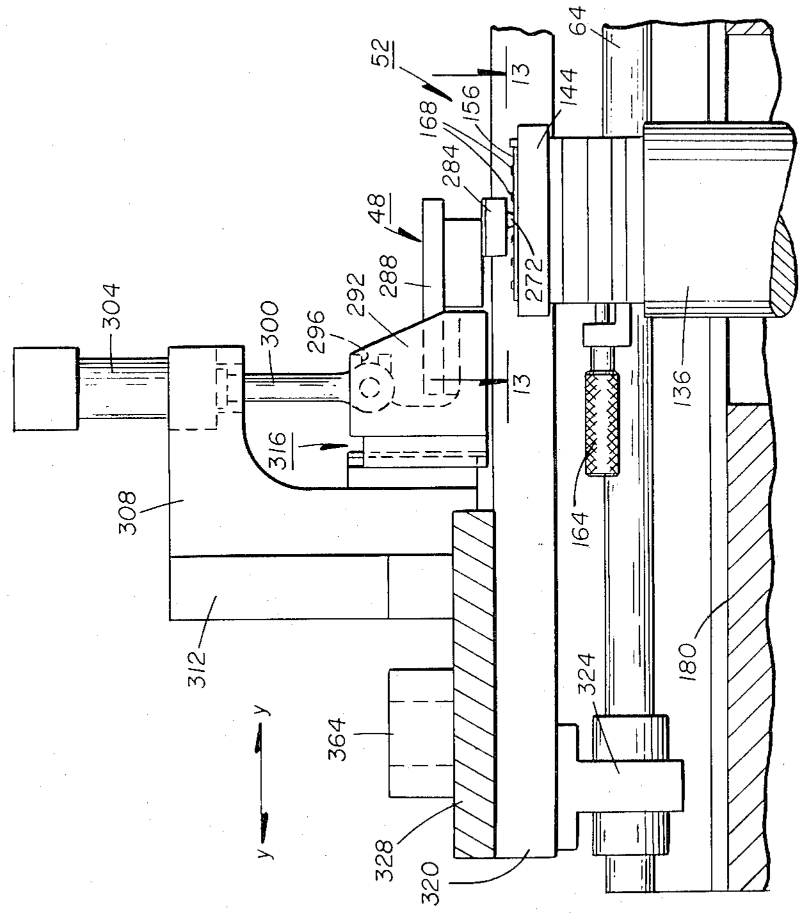
FIG. 12 is a view, partly in cross-section, of the orientation of the bonding head with respect to IC chips on a carrier.

Each of the bonding heads 48 and 56, and the supporting mechanisms therefor, are substantially identical in configuration, and in the foregoing description thereof like reference numerals shall be employed to denote like structures, the reference numerals specifically relating to the bonding head 56 and its supporting mechanism having the suffix *a.* The bonding heads 48 and 56 each include, as shown in FIG. 14, an IC chip pickup and bonding tip 272. The tip 272 has a passageway 276 in the center thereof adapted to receive the body portion 277 of an IC chip 168 while a lower peripheral edge 280 thereof engages peripherally extending leads 281 of the IC chip. The IC chip 168 is secured to the bonding tip 272, to be transported thereby, by a vacuum applied through the passageway 276 by any suitable source of vacuum (not shown). As shown in FIG. 12, the bonding tip 272 is secured to a lower portion of an electric heater cartridge 284 to be heated thereby when the tip 272 bonds the leads on the IC chip 168 to conductors on a substrate 88. The electric heater 284 is in turn secured to the lower portion of a horizontal extension 283 of a member 292 which is pivotally connected within an upper furcated portion 296 thereof to the lower end of a plunger 300 of an air cylinder 304 for vertical movement therewith in response to actuation of the air cylinder 304. The air cylinder 304 is carried by a horizontal extension 308 of an upright support 312. A Schneeberger anti-friction table 316, positioned between the member 292 and the upright support 312, is secured on one of its sides to the member 292 and on the other of its sides to the upright support 312 and guides the vertical motion of the member 292, and therefore of the IC chip pickup and bonding tip 272, in response to actuation of the air cylinder 304.

To support the bonding heads 48 and 56 for horizontal reciprocating movement in a y direction along the tracks 64, a bonding head transfer slide mechanism includes two horizontal sliding supports 320 which are each associated with, and extend along, a different one of the tracks 64, and which are slidably secured thereto at their ends by linear bearings 324 which connect with the trackss 64 in a manner similar to a dovetail arrangement. Two horizontal support plates 328, one for supporting the bonding head 48 and its associated mechanisms and the other for supporting the bonding head 56 and its associated mechanisms, are extended between, and supported by, different opposite ends of the sliding supports 320 for movement therewith along the tracks 64. The lower portion of the upright support 312 is mounted on the surface of one of the plates 328, while the lower portion of the support **312*a* is mounted on the surface of the other one of the plates 328, such that the bonding heads 48 and 56 are in an opposing relationship with respect to each other and are movable along the path defined by the tracks 64** in response to movement of the bonding head transfer slide mechanism.

The positioning of the upright supports 312 and 312*a* on the plates 328 is such that, in response to movement of the bonding heads along the tracks 64, the bonding heads may be positioned either over the bonding station 32 or their associated IC chip pick-up stations 52 and 60, and the spacing between the bonding heads 48 and 56 is such that the bonding head 48 is positioned to pick up an IC chip 168 from the pick-up station 52 when the bonding head 56 is positioned above the bonding station 32 for securing an IC chip to a substrate 88 thereon, and such that the bonding head 48 is positioned above the bonding station 32 for securing an IC chip to the substrate thereon when the bonding head 56 is positioned above the chip pick-up station 60 for receiving an IC chip. It is to be appreciated that the camera 100 is mounted sufficiently high above the substrate on the bonding station 32 so as to provide clearance for the bonding heads 48 and 56 as they are alternately positioned above the bonding station 32 and beneath the camera 100.

As is best shown in FIGS. 3 and 4, reciprocating movement of the bonding heads 48 and 56 along the trackway 64 is accomplished with a reciprocating drive 332 which comprises a portion of the bonding head transfer slide mechanism. The reciprocating drive 332 is mounted on a lower shelf 336 of the table 184, and includes therewithin a conventional motor which provides a rotary input to a conventional clutch-brake unit, the output of which provides a rotary input, through a speed reducer, to an oscillating drive. The oscillating drive is a Model No. 60-FM520M-120/60 Oscillating Drive sold by the Ferguson Machine Company of St. Louis, Missouri, and connects with an output shaft 340 of the reciprocating drive 332 to provide thereto alternate forward and reverse rotations of 60° with a dwell in between. Therefore, in response to actuation of the clutch-brake unit, the output shaft 340 of the reciprocating drive 332 alternately oscillates in opposite directions through 60° rotations with a dwell between each 60° rotation.

To transfer the oscillating movement of the output shaft 340 to the bonding head transfer slide mechanism, for reciprocatingly moving the transfer slide mechanism along the trackway 64, an arm 344, secured at one of its ends to the output shaft 340, extends upward through an elongated slot 348 formed in the top 180 of the table 184, and describes a 60° oscillation in response to oscillation of the output shaft 340. A transfer arm 352, pivotally secured at one of its ends to the upper end of the arm 344 and at its other end to a bracket 356 on the plate 328a for supporting the bonding head 56, transfers the oscillating motion of the arm 344 into reciprocating motion of the transfer slide mechanism along the trackway 64.

The operation of the IC chip transfer and bonding portion of the apparatus is such that, with a supply of IC chips at each of the pick-up stations 52 and 60, and with a substrate 88 positioned on the bonding station 32, the bonding head 48 bonds an IC chip to the substrate 88 while the bonding head 56 receives an IC chip from the pick-up station 60, and when a translation of the transfer slide mechanism occurs the bonding head 56 bonds the IC chip received at the station 60 to the substrate 88 while the bonding head 48 receives an IC chip from the pick-up station 52. More particularly, assuming that the bonding head 48 has just bonded a chip to the substrate 88 and that the bonding head 56 has just received an IC chip from the pick-up station 60, with the bonding head 48 positioned above the pick-up station 52 to receive an IC chip 168 from the IC chip carrier 156, the air cylinder 304 is actuated to move the bonding tip 272 vertically downward toward the carrier to receive the body portion 277 of the chip within the passageway 276 of the bonding tip, in the manner shown in FIG. 14, and a vacuum is then applied through the passageway 276 to hold the IC chip to the bonding tip 272. At the same time, the air cylinder 304*a* is actuated to vertically lower the bonding tip 272*a*, which holds an IC chip 168, into engagement with a bonding location on the substrate 88 carried on the bonding station 32 to effect a thermocompression bond, between the leads of the IC chip and conductors on the substrate 88, with the peripheral portion 280*a* of the bonding tip 272*a* through downward pressure applied by the air cylinder 304*a* and heat provided by the heater cartridge 284*a*. The vacuum through the passageway 276*a* of the bonding tip 272*a* is then disrupted, both air cylinders 304 and 304*a* are actuated to elevate the bonding heads 48 and 56, the clutch-brake assembly of the reciprocating drive 332 is actuated to reciprocatingly move the bonding head transfer slide mechanism along the trackway 64 to position the bonding head 48 above the substrate 88 and to position the bonding head 56 above an IC chip 168 at the pick-up station 60, and the air cylinders 304 and 304*a* are then again actuated to vertically move the bonding heads 48 and 56 downward. In this case, downward movement of the bonding head 48 permits the IC chip 168 carried by the bonding tip 272 to be thermocompression bonded to conductors on the substrate 88 through the combination of pressure provided by the air cylinder 304 and heat provided by the heating element 284, and downward movement of the bonding head 56 permits the bonding tip 272*a* thereof, which has just bonded an IC chip 168 to the substrate 88, to receive another IC chip 168 carried on the IC chip carrier 156*a* at the pick-up station 60. Continued repetition of the above sequence results in the thermocompression bonding of successive IC chips 168 to conductors on the substrate 88.

In describing the basic operation of both the substrate transfer mechanism and of the bonding head transfer mechanism, it has been assumed that whenever a bonding head 48 or 56 is positioned above its associated IC chip pick-up station an IC chip 168 on a carrier 156 is positioned to be received thereby, and that when the bonding head 48 or 56 is positioned above a substrate 88 on the bonding station 32 a bonding location on the substrate 88 is positioned beneath the bonding head for receiving the IC chip carried by the bonding tip 272 or 272*a*. As previously stated, the IC chip bonding heads 48 and 56, and therefore their associated pick-up and bonding tips 272 and 272*a*, always return to the same position over the pick-up station 52 or 60 for receiving an IC chip 168 to be bonded onto a substrate. Therefore, to sequentially receive IC chips 168 within the bonding tips 272 and 272*a*, it is only necessary to sequentially position individual IC chips, on the chip carrier 156, to be received by the bonding tips when the air cylinders 304 or 304*a* are actuated to vertically move the bonding tips to a position immediately above the IC chip carrier 156 on the pick-up station 52 or 60.

Positioning successive IC chips 168 beneath the bonding tips 272 and 272*a* to be received thereby is accomplished by positioning an IC chip carrier 156, having a plurality of IC chips 168 precisely located thereon one with respect to the other, on both the horizontal plate 144 of the pick-up station 52, and on the horizontal plate 148 of the pick-up station 60, in accordance with the three locating posts 152 on each of the horizontal plates 144 and 148 which accurately position the IC chip carriers 156 in an *x-y* orientation with respect to the horizontal plates. Then, with the N/C *x* and *y* tables 124 and 128 in their 0,0 position, a selected one of the chips on each of the pick-up stations 52 and 60 is positioned, as shown in FIG. 15, within the reticle of a different microscope 172 associated with that station and secured to an individual one of the plates 238 by a mount 360, by manually adjusting the micrometer adjustment drives 160 and 164 associated with each pick-up station. Each microscope is positioned such that the area viewed within the reticle thereof is the area above which the bonding tip 272 or 272*a* comes in immediate proximity with upon actuation of the air cylinder 304 or 304*a*. Therefore, with an IC chip 168 on each of the carriers 156 positioned within a reticle of each of the microscopes, at least one IC chip at each bonding station 52 or 60 is positioned to be received within the bonding tip 272 or 272*a* associated therewith. Since the IC chips 168 on the carriers 156 are accurately positioned with respect to each other, and since a selected chip at each bonding station is now accurately positioned to be received by an associated bonding tip with the N/C *x* and *y* tables 124 and 128 in their 0,0 position, the N/C *x* and *y* tables 124 and 128 may be sequentially actuated by the controller to position successive IC chips 168 on the pick-up stations 52 and 60 to be received by an associated bonding tip 272 or 272*a* for transfer to, and for thermocompression bonding on, the substrate 88 carried on the bonding station 32.

The bonding heads 48 and 56, and therefore their associated bonding tips 272 and 272*a*, are arranged to always deliver an IC chip 168 to the same position over the bonding station 32. Therefore, it is only necessary to accurately position sequential bonding locations on a substrate 88, carried on the bonding station 32, beneath the tip 272 or 272*a* to enable IC chips to be bonded thereto upon actuation of the air cylinder 304 or 304*a*. This is accomplished by precisely orienting the substrate 88 with respect to the N/C *x* and *y* tables 68 and 72, and by then actuating the tables 68 and 72 with the preprogrammed controlled to sequentially position selected bonding locations on the substrate beneath the bonding heads. The accurate orienting of the substrate 88 on the bonding station 32, with respect to the N/C *x* and *y* tables 68 and 72, was described as being accomplished through the sequential detection of two reference dots 92 and 96 on the substrate 88 with a tv camera 100, and in the preferred embodiment of the invention is an automatic operation.

To automatically orient a substrate 88 with respect to the N/C *x* and *y* tables 68 and 72, the substrate is initially positioned on the upper surface of the pick-up station 28 by means of four locating posts 368, as shown in FIG. 2. The locating posts 368 orient the substrate 88 with respect to the transfer head 24 when it is picked up thereby so that, with the N/C *x* and *y* tables 68 and 72 in their 0,0 position, the substrate is carried by the transfer head to the bonding station 32 and initially positioned thereon with the reference dot 92 thereof within 10 mils of the 0,0 position of the tables 68 and 72 and with the reference dot 96 within 10 mils of a predetermined *x,y* position of the tables 68 and 72. As is shown in FIG. 6, the substrate bonding station 32 includes a horizontal plate 372, carried on the analog x table 76 by upright posts 376, for supporting the substrate 88. To insure that the substrate 88 remains securely in position on the plate 372, a vacuum is provided through a vacuum line 380 to a plurality of passageways 384 formed through the plate 372 to hold the substrate 88 to the plate 372.

It is desirable to illuminate the reference dots 92 and 96 to facilitate detection thereof by the camera 100. To this end, back lighting, rather than front lighting, of the dots is preferred, as front lighting tends to produce a scattered light or reflected image. One convenient technique for back lighting the dots 92 and 96 on the substrate 88 is to carry light from a source of light 388, secured to the analog $\theta$ table 84 by a mount 389, through two fiber optic light pipes 392 to each of two mirrors 396 and 397, positioned beneath the plate 372, and angled to reflect light from the light pipes 392 along a path parallel to the optical axis of the camera 100. The mirror 396 is positioned over the axis of rotation of the $\theta$ analog table 84 for back lighting the reference dot 92, and the mirror 397 is positioned, with the N/C *x* and *y* tables 68 and 72 in their 0,0 position, at the predetermined *x,y* position of the reference dot 96 for back lighting the reference dot 96. To allow passage of the light beams to the dots 92 and 96, the plate 372 may be either of a transparent material or have an aperture formed therethrough at each of its positions beneath the reference dots 92 and 96. It is of course understood that the combination of the intensity of the light directed onto the lower surface of the substrate 88 beneath the reference dots 92 and 96, and the optical density of the material of the substrate 88, is such that sufficient light will pass through the body of the substrate 88 to illuminate the reference dots 92 and 96 for detection by the camera 100. It is to be noted that if the substrate 88 is of a type having a continuous metal layer on its lower surface, which in the operation of the circuitry on the upper surface serves as a common ground, then areas 400, as shown in FIG. 7, of the metal layer immediately underlying each of the reference dots 92 and 96 must be removed to permit passage of light through the substrate 88 to illuminate the reference dots.

Each reference dot 92 and 96 is 25 mils in diameter, and since the reference dot 92 has been positioned, upon transfer of the substrate 88 from the substrate pick-up station 28 to the bonding station 32 by the substrate transfer head 24, within 10 mils of the 0,0 position of the N/C *x* and *y* tables 68 and 72, which is in alignment with the optical axis of the camera 100, an image of the back lighted dot 92 will be provided by the camera 100 on the screen of the monitor 104 and will be detected by at least one of the four photocells 108, 112, 116 and 120 fastened to the screen of the monitor. The photocells are positioned to each partially overlie a portion of the periphery of the reference dot 92, as detected by the camera 100, when the dot 92 is directly centered above the 0,0 reference point of the N/C *x* and *y* tables 68 and 72.

Figure 17:
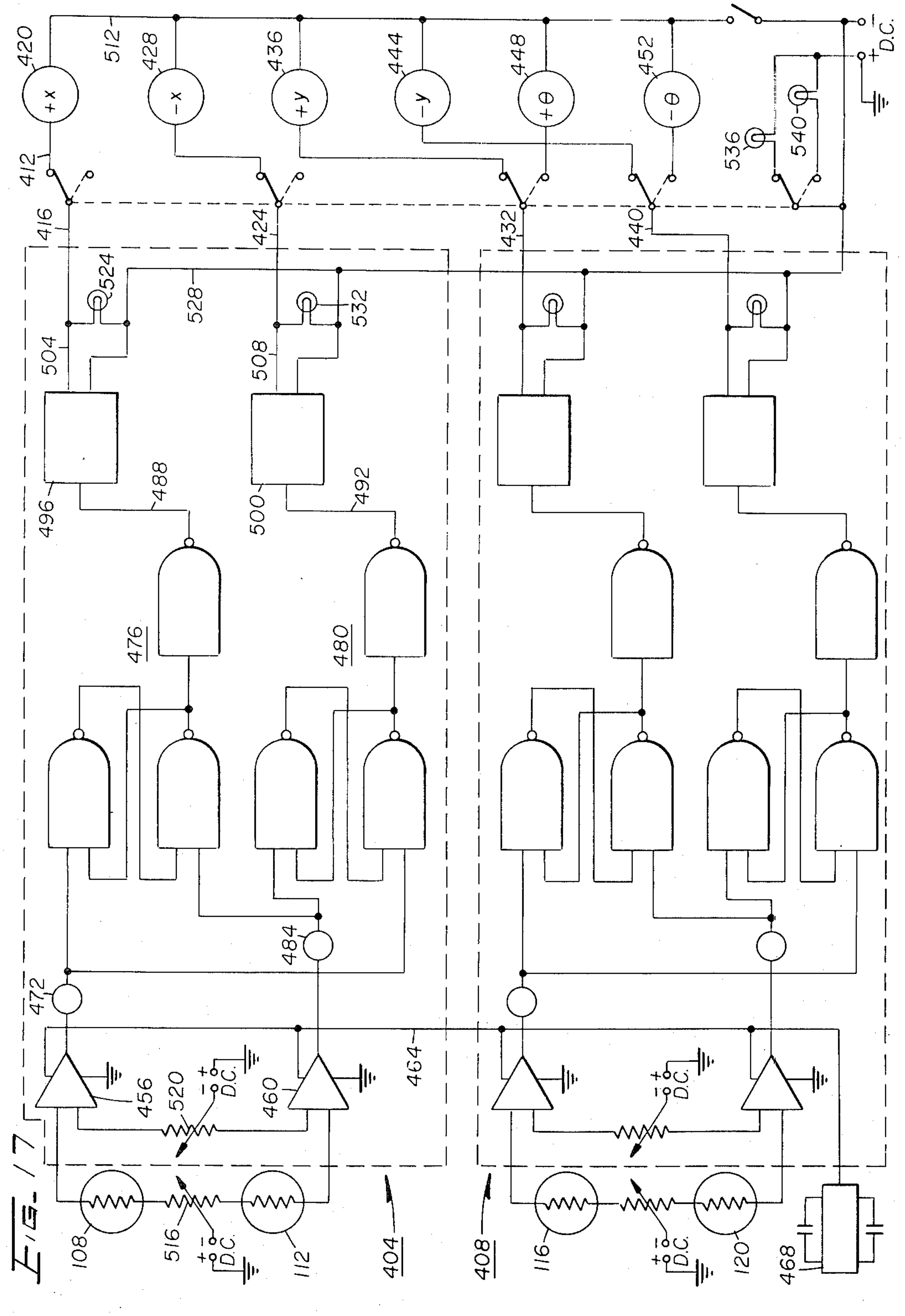
FIG. 17 is a circuit for actuating an X, Y, $\theta$ table, in response to outputs provided by the photocells of FIG. 8, to orient a substrate for receiving IC chips.

To orient the substrate 88 on the bonding station 32 with respect to the N/C *x* and *y* tables 68 and 72, the photocells 108 and 112 each provide an input to a circuit 404, as shown in FIG. 17, and the photocells 116 and 120 each provide an input to an identical circuit 408, for selectively actuating drive motors associated with the analog x, y and $\theta$ tables 76, 80 and 84, respectively, in accordance with the value of the signal provided by each of the photocells in response to the intensity of the image, on the screen of the monitor 104, detected thereby. As is seen in FIG. 8, there are two light intensities, a dark image where the raster defines the reference dot and a brilliant intensity background elsewhere, on the screen of the monitor 104. With the reference dot 92 positioned within 10 mils of the optical axis of the camera 100, and with a two-position function switch 412 in a first position as shown in solid lines, an output 416 from the circuit 404 selectively actuates a motor 420 to move the analog x table in a $+x$ direction, and an output 424 from the circuit 404 selectively actuates a motor 428 to move the analog *x* table 76 in a $-x$ direction, in accordance with signals provided to the circuit 404 by the photocells 108 and 112, until the reference dot 92 is centered on the screen of the monitor 104 with respect to both of the photocells 108 and 112. Simultaneously, and in a similar manner, an output 432 from the circuit 408 actuates a motor 436 to move the analog *y* table 80 in a $+y$ direction, and an output 440 from the circuit 408 actuates a motor 444 to move the analog *y* table 80 in a $-y$ direction, in accordance with the value of signals provided by the photocells 116 and 120 to the circuit 408, until the reference dot 92 is centered on the monitor 104 with respect to the photocells 116 and 120. This centers the reference dot 92 on the screen of the monitor 104 such that each of the photocells 108, 112, 116 and 120 overlies a portion of the periphery of the reference dot, and therefore centers the reference dot 92 with respect to the 0,0 reference point of the N/C *x* and *y* tables 68 and 72.

After the reference dot 92 has been centered with respect to the photocells 108, 112, 116 and 120, the N/C *x* and *y* tables 68 and 72 are actuated by the controller to move to the predetermined *x,y* position of the reference dot 96 to position the reference dot within 10 mils of the optical axis of the camera 100, and the function switch 412 is switched to a second position as shown in broken lines. With the function switch 412 in its second position, the outputs 416 and 424 from the circuit 404 are disconnected from the motors 420 and 428, and the outputs 432 and 440 from the circuit 408 are disconnected from the motors 436 and 444 and are connected with a different one of two motors 448 and 452, respectively, for controlling the movement of the analog $\theta$ table 84. As previously stated, the *x,y* position of the reference dot 96 preferably lies along the *x* axis of the N/C *x* and *y* tables 68 and 72, and with the reference dot 96 positioned within 10 mils of the optical axis of the camera 100 at least one of the photocells 116 or 120 will sense the presence thereof on the screen of the monitor 104 and provide an input to the circuit 408 to actuate either the motor 448, with the output 432, to move the analog $\theta$ table 84 in the $+\theta$ direction, or to actuate the motor 452, with the output 440, to move the analog $\theta$ table 84 in the $-\theta$ direction, until the reference dot 96 is centered with respect to each of the photocells 116 and 120. That actuation of the analog $\theta$ table 84 centers the reference dot 96 with respect to the photocells 116 and 120 is evident since, in this case, the reference dot 92 is already precisely centered over the 0,0 reference point of the N/C *x* and *y* tables 68 and 72, and therefore over the axis of rotation of the analog $\theta$ table 84, and upon rotation of the analog $\theta$ table 84 the reference dot 96 must of necessity define an arc which passes through both of the photocells 116 and 120. That is, the linear distance between the reference dots 92 and 96 is precisely known and, if the reference dot 96 lies along the *x* axis of the N/C *x* and *y* tables 68 and 72, then in shifting the N/C *x* and *y* tables to the predetermined *x,y* position of the reference dot 96, which shifts the substrate a linear distance equal to the linear distance between the reference dots 92 and 96, the dot must underlie at least one of the photocells 116 or 120 on the screen of the monitor 104 and define an arc, upon rotation of the analog $\theta$ table 84, which passes under both of the photocells 116 and 120.

The specific operation of the circuits 404 and 408 in centering the reference dots 92 and 96 with respect to the photocells 108, 112, 116 and 120 shall be explained with reference to the circuit 404. Since the circuits 404 and 408 are identical, it is to be understood that the circuit 408 operates in a manner similar to, and simultaneous with, the circuit 404. In the description of the operation of the circuit, signals from outputs, or to inputs, may be in either a first ("1") or a second ("0") state, and shall be so described, it being understood that the reference to a 1 or a 0 state merely refers to a particular one out of two conditions that a signal may assume. With the function switch 412 in its first position to connect the output 416 of the circuit 404 with the motor 420 and to connect the output 424 with the motor 428, the photocell 108 provides one input to an operational amplifier (op amp) 456 and the photocell 112 provides one input to an op amp 460. A second input to each of the op amps 456 and 460, which samples the first input thereto or provides a reference with which the first input is compared, is applied over a conductor 464 by a monostable multivibrator 468. Each of the op amps 456 and 460 compares the inputs applied thereto, or the difference between the inputs applied thereto, and is characterized in that an output is provided therefrom whenever a 1 input is simultaneously applied to each of the inputs thereto, and in the circuit of the invention the op amps are Navigation Computer Corporation Model 522 circuit packs.

Each of the photocells 108 and 112 provides a pulse 1 input to its associated op amp 456 or 460 with each sweep of the raster on the monitor 104 if during that sweep the photocell detects a raster image of sufficient light intensity. As is seen in FIG. 8, the photocells 108 and 112, which control the positioning of the analog *x* table 76, are offset with respect to a vertical sweep of the raster on the screen of the monitor 104 so that they are sequentially, and not simultaneously, swept thereby. The output from the monostable multivibrator 468 preferably occurs at approximately three times the raster sweep rate, and in the case of a raster sweep rate of 60 cycles per second the multivibrator 468 provides output pulses of a 1 state at the rate of 180 pulses per second to periodically sample the input provided to each of the op amps 456 and 460 by its associated photocell 108 and 112, respectively. This permits an output to be obtained from the op amp 456 if, during the sampling of the photocell input thereto, the photocell 108 detects a sufficient light intensity provided by the raster, and permits an output to be obtained from the op amp 460 if, during the sampling of the photocell input thereto, the photocell 112 detects a sufficient light intensity provided by the raster.

The output from the op amp 456 is applied through a squaring inverter 472 to a first input of each of two dc flip flops 476 and 480. Similarly, the output from the op amp 460 is applied through a squaring inverter 484 to a second input to each of the dc flip flops 476 and 480. Each squaring inverter 472 and 484 provides a 1 or 0 output therefrom as the analog input thereto from the op amp 456 or 460, respectively, makes excursions past predetermined threshold voltages. The dc flip flops 476 and 480 each provide and maintain a 1 signal at an output 488 or 492 thereof, respectively, in response to the occurrence of a 0 signal applied to the first input thereof while a 1 signal is applied to the second input thereof, and remove the energizing signal from its output in response to a 0 signal applied to the second input thereof while a 1 signal is applied to the first input thereof. Each of the flip flops 476 and 480 is comprised of a plurality of squaring inverter circuits, and in the present invention the inverters 472 and 484, and the inverters of the flip flops 476 and 480, are Navigation Computer Corporation Model 466 circuit packs.

The output 488 of the dc flip flops 476 is applied as an input to a driver circuit 496 and the output 492 of the dc flip flop 480 is applied as an input to a driver circuit 500. The driver circuits 496 and 500 are Navigation Computer Ccorporation Model 473 circuit packs, and are responsive to a 1 signal applied to the input thereof to provide a ground potential at an output 504 or 508 thereof, respectively, and are responsive to a 0 signal applied to the input thereof to provide a negative potential at their output. The output 504 of the driver circuit 496 is connected, with the function switch 412 in the first position, to one input of the motor 420, the other input of which is connected to a negative source of dc potential through a conductor 512, for selectively energizing the motor 420 to move the analog $x$ table 76 in the $+x$ direction. Similarly, the output 508 of the driver circuit 500 is connected to one input of the motor 428, the other input of which is connected to the negative source of dc potential through the conductor 512, for selectively energizing the motor 428 to move the analog $x$ table 76 in the $-x$ direction. The circuit 404 is arranged to provide, in response to a 1 output from the op amp 456, a 1 signal at the output 488 of the dc flip flop 476 to actuate the motor 420 through the driver circuit 490, and to provide, in response to a 1 output from the op amp 460, a 1 signal at the output 492 of the dc flip flop 480 to energize the motor 428 through the driver circuit 500.

Assume, for the purpose of illustrating the operation of the circuit 404, that with the reference dot 92 positioned beneath the camera 100 the image thereof on the monitor 104 underlies the photocell 112 but does not underlie the photocell 108. In this case, with each sweep of the raster a 1 outut pulse is provided from the photocell 108 to the op amp 456 as a result of the photocell detecting an image of sufficient light intensity, while a 0 output is continuously provided from the photocell 112 since, with each sweep of the raster, only the dark area of the reference dot 92, as shown on the screen of the monitor 104, is sensed by the photocell 112. Upon the simultaneous occurrence of a 1 pulse from the photocell 108 and from the multivibrator 468 at each of the inputs to the op amp 456, a 1 signal is obtained from the output of the op amp 456 and applied, through the inverter 472, to the first inputs of the dc flip flops 476 and 480 as a 0 signal. At this time, the dc flip flops 476 and 480 have a 1 signal applied to the second inputs thereof from the op amp 460 through the inverter 484. This applies a 1 signal to the input of the driver circuit 496 from the output 488 of the dc flip flop 476 and a 0 signal to the input of the driver circuit 500 from the output 492 of the dc flip flop 480 to provide a ground potential at the output 504 of the driver circuit 496 and a negative potential at the output 508 of the driver circuit 500. The ground potential on the output 504 of the driver circuit 496 energizes the motor 420 to move the analog $x$ table 76 in the $+x$ direction, while the negative potential on the output 508 of the driver circuit 500 keeps the motor 428, for moving the analog $x$ table 76 in the $-x$ direction, deenergized. Movement of the analog $x$ table 76 in the $+x$ direction moves the reference dot 92 on the screen of the monitor 104 away from the photocell 112 and toward the photocell 108. During the time that the photocell 112 completely overlies the reference dot 92, the motor 420 will run continuously to move the analog $x$ table 76 in the $+x$ direction since, in the absence of an output pulse from the photocell 112, the dc flip flop 476 maintains a 1 signal at its output 488 to keep the motor 420 energized, while the dc flip flop 480 maintains a 0 signal on its output 492 to keep the motor 428 in a deenergized condition.

When the analog $x$ table 76 has shifted sufficiently in the $+x$ direction, so that the photocell 112 detects an increased light intensity as the reference dot 92 begins to move from thereunder, 1 pulses are applied by the photocell 112 to the input of the op amp 460 with each sweep of the raster. Simultaneously, the photocell 108, which may now partially overlie the reference dot on the screen of the monitor 104, continues to apply 1 input pulses to the op amp 456 with each sweep of the raster. At this time, as a result of the periodic sampling of the inputs to the op amps 456 and 460 by the multivibrator 468, the op amps 456 and 460 will alternately provide 1 signals at their outputs to switch the dc flip flops 476 and 480 back and forth between their two states to alternately energize the motors 420 and 428 to step the analog $x$ table 76 alternately in the $+x$ and $-x$ directions. The alternate pulsing of the motors 420 and 428 prevents the motors from simultaneously "bucking" or opposing each other, and very quickly results in the dot 92 being positioned on the screen of the monitor 104 to equally underlie the photocells 108 and 112 as a result of an averaging effect. It is understood, of course, that if the photocell 103 initially entirely overlaid the reference dot 92 on the screen of the monitor 104, while the photocell 112 did not overlie the reference dot at all, that in the initial operation of the circuit 404 the motor 428, and not the motor 420, would be energized to continuously move the N/C $x$ table 68 in the $-x$ direction toward the photocell 112.

To balance the photocells 108 and 112, so that pulse outputs are provided therefrom when the photocells overlie equal areas of the reference dot 92, and therefore equal "brilliant" areas of the raster image, a variable resistor 516 is connected between each of the photocells 108 and 112 and a source of positive potential, and a variable resistor 520 is connected between a reference input to each of the op amps 456 and 460 and a source of negative potential. Adjustment of each of the resistors 516 and 520 permits the photocells 108 and 112 to be balanced so that 1 pulse outputs are provided therefrom, as they are swept by the raster, when equal brilliant areas of the raster are detected thereby, which permits a reference dot to be precisely centered therebetween. To obtain a visual determination of the state of the motors 420 and 428, and to provide a load for the collapsing field of the motor winding to allow rapid braking of the motor when the motor is deenergized, an indicator lamp 524 is connected between the output 504 of the driver 496 and a source of negative potential through a conductor 528, and an indicator lamp 532 is connected between the output 508 of the driver 500 and the source of negative potential through the conductor 528.

It is to be remembered that the circuit 408 operates simultaneously with, and in a manner similar to, the circuit 404 to actuate the analog *y* table 80 through selective energization of the motors 436 and 444 to center the reference dot on the screen of the monitor 104 with respect to the photocells 116 and 120. Therefore, while it is obvious that the reference dot 92 may be centered with respect to the photocells 108 and 112 only when the photocells lie along a diameter of the reference dot, it is to be appreciated that, if the reference dot does not initially have a y orientation which permits the photocells 108 and 112 to lie along a diameter thereof, the simultaneous operation of the circuit 408 with the circuit 404 will bring the reference dot to such a *y* orientation. Furthermore, with the N/C *x* and *y* tables 68 and 72 shifted to the predetermined *x,y* position of the reference dot 96, which brings the reference dot 96 on the substrate 88 beneath the camera 100 for projection onto the screen of the monitor 104, and with the function switch 412 in its second position to disconnect the outputs 416 and 424 from the motors 420 and 428 and to connect the outputs 432 and 440 to the motors 448 and 452, it may be readily understood that the photocells 116 and 120 respond to the image of the reference dot 96 on the screen of the monitor 104 in a manner which actuates the circuit 408 to energize the motors 448 and 452 to rotate the analog $\theta$ table 84 in either a $+\theta$ or a $-\theta$ direction of rotation until the reference dot 96 is centered with respect to the photocells 116 and 120. To visually indicate the position of the function switch 412, an indicator light 536 is connected between a source of ground and a negative potential when the switch 412 is in its first position, and an indicator light 540 is connected between the source of ground and the negative dc potential when the switch 412 is in its second position.

Figure 18:
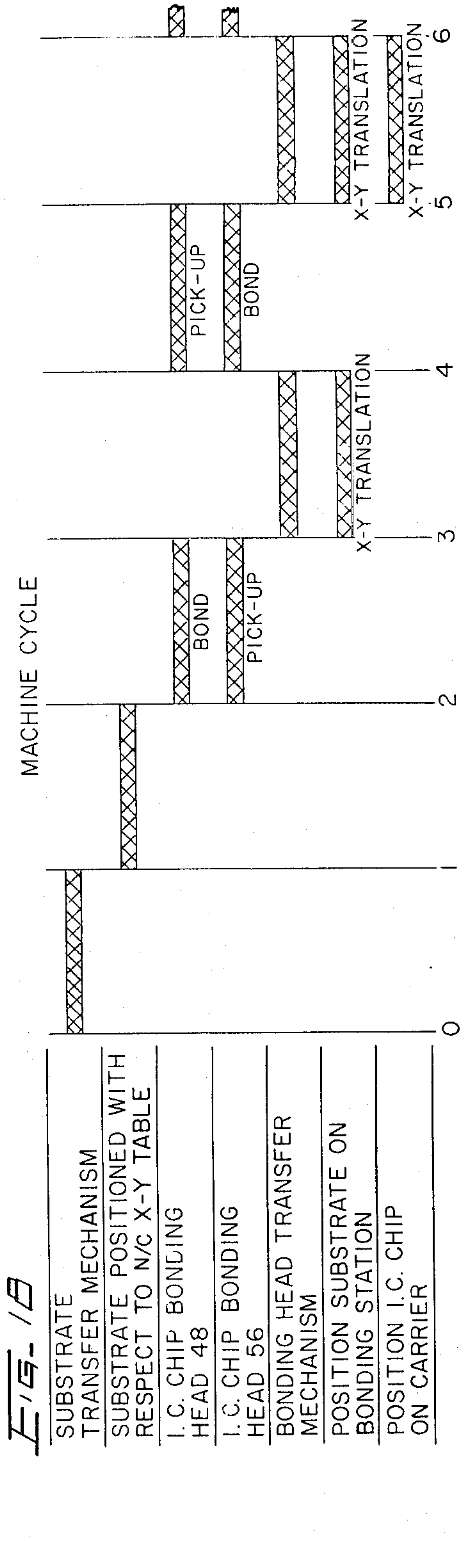
FIG. 18 is a chart generally showing the sequence of operation of the apparatus of the invention.

With the reference dots 92 and 96 accurately positioned with respect to the N/C *x* and *y* tables 68 and 72, which therefore positions each and every bonding location on the substrate 88 with respect to the N/C *x* and *y* tables 68 and 72, and with the IC chips 168 on the carriers 156 accurately positioned with respect to the N/C *x* and *y* tables 124 and 128, successive IC chips 168 may be removed from the carriers 156 and sequentially positioned at selected bonding locations on the substrate 88, as shown in FIG. 16, with each lead 544 thereof accurately positioned on an associated substrate conductor 548 for bending thereto. FIG. 18 shows the cycle of operation of the bonding mechanism of the invention.

While one embodiment of the invention has been described in detail, it is understood that various other modifications and embodiments may be devised by one skilled in the art without departing from the spirit and scope of the invention. For example, while the bonding heads have been described as always returning to the same position over a substrate on the bonding station for bonding an IC chip to bonding locations sequentially positioned therebeneath, bonding of IC chips could just as readily be accomplished, after the substrate has been oriented in accordance with the teachings of the invention, by maintaining the substrate stationary while translating the bonding heads to the coordinate positions of the bonding locations. In this case a mechanism for translating the bonding heads, such as an additional N/C *x* and *y* table, would be required. Also, while the substrate orientation has been described in terms of positioning the first reference mark at a first coordinate point, translating the substrate a distance equal to the distance between the first and second reference marks to position the first mark at a second coordinate point, and rotating the substrate about the second point to position the second mark at the first point, the substrate could just as readily be oriented, after positioning the first mark at the first point, by rotating the substrate about the first point, while detecting the position of the second mark with respect to a second coordinate point, to position the second mark at the second point. In this case, a second tv camera, or mirrors for deflecting the image viewed by the first tv camera, would be required for viewing an area of the substrate surrounding the second point.

We claim:

1. In a method of bonding circuit elements to a substrate at selected areas on a surface thereof;

moving a first group of circuit elements along *x-y* axes to position successive elements thereof in a first pickup position;

moving a second group of circuit elements along x-y axes to position successive elements thereof in a second pickup position;

moving the substrate along x-y axes to position successive selected areas of the substrate in a bond position;

alternately picking up each of the elements of the first and the second groups of circuit elements moved to the first and the second pickup positions;

transferring each picked up circuit element of the first group to the selected area on the substrate then at the bond position, while the step of moving the second group of circuit elements is taking place;

bonding the transferred circuit element of the first group to the selected area on the substrate at the bond position while the step of picking up a circuit element of the second group at the second pickup position is taking place;

transferring each picked up circuit element of the second group to the selected area on the substrate then at the bond position, while the step of moving the first group of circuit elements is taking place, and bonding the transferred circuit element of the second group to the selected area on the substrate at the bond position while the step of picking up a circuit element of the first group at the first pickup position is taking place.

2. In a method as set forth in claim 1, wherein the first and the second pickup positions are on opposite sides of the bond position, wherein the transferring step includes the sequential steps of:

elevating a circuit element of the first group from the first pickup position to a point above the first pickup position;

translating the circuit element of the first group along a linear path in a first direction from the point above the first pickup position to a point above the bond position;

lowering the circuit element of the first group from the point above the bond position to the selected area on the substrate at the bond position;

elevating a circuit element of the second group from the second pickup position to a point above the second pickup position;

translating the circuit element of the second group along a linear path in a second direction which is opposite to the first direction from the point above the second pickup position to the point above the bond position;

lowering the circuit element of the second group from the point above the bond position to the selected area on the substrate at the bond position, and repeating the above steps.

3. In a method of bonding workpieces selected from first and second arrays thereof to bond sites on a surface of an article:

sequentially moving the article to position successive bond sites at a first location;

sequentially moving the first array of workpieces, upon the first and then upon alternate movements of the article, to position successive workpieces thereof at a second location;

sequentially moving the second array of workpieces, upon the second and then upon alternate movements of the article, to position successive workpieces thereof at a third location;

transferring each workpiece of the first array positioned at the second location to the bond site on the article then at the first location, while the step of moving the second array of workpieces is taking place;

bonding the transferred workpiece of the first array to the bond site on the article at the first location;

transferring each workpiece of the second array positioned at the third location to the bond site on the article then at the first location, while the step of moving the first array of workpieces is taking place, and bonding the transferred workpiece of the second array to the bond site on the article at the first location.

4. In a method of bonding the leads of integrated circuit elements to conductive paths on a surface of a substrate at bond sites thereon:

positioning a first supply array of circuit elements on a first support;

positioning a second supply array of circuit elements on a second support;

positioning a substrate at a substrate supply station;

moving the substrate in a first direction, along a path perpendicular to a line between the first and the second supports, to a third support intermediate the first and the second supports, and positioning the substrate thereon;

sequentially translating the third support to position successive bond sites at a bond location;

sequentially translating the first support, upon the first and then upon alternate translations of the third support, to position successive circuit elements of the first supply array at a first pickup location;

sequentially translating the second support, upon the second and then upon alternate translations of the third support, to position successive circuit elements of the second supply array at a second pickup location;

alternately picking up each of the circuit elements of the first and the second arrays positioned at the first and the second pickup locations;

transferring each picked up circuit element of the first supply array to the bond site on the substrate then at the bond location, while the step of translating the second support is taking place, and positioning the leads thereof over the conductive paths on the substrate at the bond site;

bonding the leads of the circuit element of the first supply array to the conductive paths on the substrate at the bond site while the step of picking up a circuit element of the second supply array is taking place;

transferring each picked up circuit element of the second supply array to the bond site on the substrate then at the bond location, while the step of translating the first support is taking place, and positioning the leads thereof over the conductive paths on the substrate at the bond site;

bonding the leads of the circuit element of the second supply array to the conductive paths on the substrate at the bond site while the step of picking up a circuit element of the first supply array is taking place, and moving the substrate, after the leads of a predetermined number of integrated circuit elements have been bonded thereto, in the first direction along the path perpendicular to the line between the first and the second supports, to a substrate receiving station.

* * * * *